United States Patent
Lin et al.

(10) Patent No.: US 10,068,977 B2
(45) Date of Patent: Sep. 4, 2018

(54) POWER MOSFET WITH A DEEP SOURCE CONTACT

(71) Applicant: Texas Instruments Incorporated, Dallas, TX (US)

(72) Inventors: Furen Lin, Chengdu (CN); Frank Baiocchi, Allentown, PA (US); Haian Lin, Bethlehem, PA (US); Yunlong Liu, Chengdu (CN); Lark Liu, Chengdu (CN); Wei Song, Chengdu (CN); ZiQiang Zhao, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/601,591

(22) Filed: May 22, 2017

(65) Prior Publication Data

US 2018/0204917 A1 Jul. 19, 2018

Related U.S. Application Data

(63) Continuation of application No. PCT/CN2017/071646, filed on Jan. 19, 2017.

(51) Int. Cl.
| | |
|---|---|
| *H01L 29/417* | (2006.01) |
| *H01L 29/06* | (2006.01) |
| *H01L 29/40* | (2006.01) |
| *H01L 29/78* | (2006.01) |

(Continued)

(52) U.S. Cl.
CPC ...... *H01L 29/41741* (2013.01); *H01L 27/088* (2013.01); *H01L 29/0696* (2013.01); *H01L 29/402* (2013.01); *H01L 29/41775* (2013.01); *H01L 29/66689* (2013.01); *H01L 29/7816* (2013.01); *H01L 29/7834* (2013.01)

(58) Field of Classification Search
CPC ............ H01L 29/41741; H01L 27/088; H01L 29/66689; H01L 29/7834; H01L 29/402; H01L 29/0696; H01L 29/41775; H01L 29/7816

See application file for complete search history.

(56) References Cited

U.S. PATENT DOCUMENTS

| | | | | |
|---|---|---|---|---|
| 6,972,460 B2 * | 12/2005 | Aida | ...................... | H01L 29/402 257/339 |
| RE42,403 E * | 5/2011 | Babcock | ............. | H01L 29/7835 257/328 |
| 9,853,144 B2 * | 12/2017 | Lin | ..................... | H01L 29/7816 |

(Continued)

*Primary Examiner* — Jarrett Stark

(74) *Attorney, Agent, or Firm* — Andrew R. Ralston; Charles A. Brill; Frank D. Cimino

(57) ABSTRACT

A power MOSFET IC device including an array of MOSFET cells formed in a semiconductor substrate. The array of MOSFET cells comprises an interior region of interior MOSFET cells and an outer edge region of peripheral MOSFET cells, each interior MOSFET cell of the interior region of the array comprising a pair of interior MOSFET devices coupled to each other at a common drain contact. In an example embodiment, each interior MOSFET device includes a source contact (SCT) trench extended into a substrate contact region of the semiconductor substrate. The SCT trench is provided with a length less than a linear portion of a polysilicon gate of the interior MOSFET device, wherein the SCT trench is aligned to the polysilicon gate having a curvilinear layout geometry.

12 Claims, 7 Drawing Sheets

(51) Int. Cl.
*H01L 29/66* (2006.01)
*H01L 27/088* (2006.01)

(56) References Cited

U.S. PATENT DOCUMENTS

| | | | |
|---|---|---|---|
| 2013/0193502 A1* | 8/2013 | Kocon | H01L 29/7811 257/302 |
| 2014/0034999 A1* | 2/2014 | Korec | H01L 29/7393 257/140 |
| 2014/0284701 A1* | 9/2014 | Korec | H01L 29/7824 257/328 |
| 2017/0207335 A1* | 7/2017 | Lin | H01L 29/7816 |
| 2018/0076320 A1* | 3/2018 | Lin | H01L 29/66659 |
| 2018/0090490 A1* | 3/2018 | Lin | H01L 27/0883 |

* cited by examiner

POWER MOSFET WITH A DEEP SOURCE CONTACT

FIELD OF THE DISCLOSURE

This disclosure relates generally to the field of semiconductor devices and the methods of fabrication thereof, and more particularly, without limitation, to a power MOSFET device and its fabrication.

BACKGROUND

A power MOSFET is a specific type of metal oxide semiconductor field-effect transistor designed to handle significant power levels (e.g., typically involving switching of more than 1 A). Power MOSFETs are well known for superior switching speed, and are used in many applications such as power supplies, DC-to-DC converters, low-voltage motor controllers, as well as switches in other high-frequency pulse width modulation (PWM) applications, and the like.

Efficiency and power loss in microelectronic devices including power MOSFETs present some trade-offs in power electronics applications. Engineers are continually challenged to increase power density and at the same time reduce the amount of power dissipated in the applications. The reduced power dissipation helps keep the device temperatures under certain specifications, which has given rise to a constant demand for better operational efficiencies in power MOSFET applications. For example, traditional approaches to improve efficiency in DC/DC synchronous buck converters include reducing conduction losses in the MOSFETs through designing lower on-state resistance ($R_{DSON}$) devices and lowering switching losses through reducing device capacitances. However, current technologies to achieve incremental improvements in $R_{DSON}$ are at a point of diminishing returns because of the trade-off required between the device's breakdown voltage and its on-state resistance. This is because the breakdown voltage of the device directly impacts the resistive contribution.

As the advances in the design of integrated circuits and semiconductor fabrication continue to take place, improvements in semiconductor devices, including power MOSFETs, are also being concomitantly pursued.

SUMMARY

The following presents a simplified summary in order to provide a basic understanding of one or more aspects of the present disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

In one aspect, an embodiment of an IC, e.g., a power MOSFET IC, and its fabrication is disclosed which overcomes several challenges that may be encountered in processing deep source contact (SCT) trench features required in an IC fabrication flow by utilizing one or more innovative SCT layout design enhancements. Example IC comprises, inter alia, a semiconductor substrate having a top surface and a bottom surface; and at least one MOSFET cell formed in the semiconductor substrate. The MOSFET cell comprises a pair of MOSFET devices coupled to each other at a common drain contact, wherein at least one MOSFET device includes an SCT trench extended into a substrate contact region in the semiconductor substrate proximate to the bottom surface. The SCT trench is provided with a length along the top surface less than a linear portion of a polysilicon gate of the at least one MOSFET device, wherein the SCT trench is aligned to a complementary contour of the polysilicon gate having a curvilinear layout geometry (e.g., self-aligned source).

In another aspect, an embodiment of a laterally diffused metal-oxide-semiconductor transistor (LDMOS) device is disclosed that comprises, inter alia, a semiconductor substrate having a top surface and a bottom surface, the semiconductor substrate having a doped layer positioned adjacent to the top surface and having an upper surface; source and drain regions of a first conductivity type formed in the doped layer proximate the upper surface of the doped layer, the source and drain regions being spaced from one another and separated by a channel region of a second conductivity type formed in the doped layer, the channel region having a portion extending under the source region, wherein the drain region comprises a doped drain (e.g., LDD) region formed adjacent to the channel region; a doped drain contact region spaced from the channel region by the lightly doped drain region; a conductive gate having an upper surface and sidewall surfaces, the conductive gate formed over a gate dielectric layer formed over the channel region, the conductive gate at least partially overlapping the source and drain regions; and a conducting path connecting the source region and the doped substrate via a conductor disposed in an SCT trench formed in the doped layer and extended into a substrate contact region in the semiconductor substrate. The SCT trench has a length, e.g., defined along the upper surface of the doped layer or the top surface of the semiconductor substrate, that is less than a linear portion of the conductive gate, the SCT trench aligned to the conductive gate formed as having a curvilinear geometry. A first insulating layer is formed over the upper surface and sidewall surfaces of the conductive gate. A field plate is provided over the lightly doped drain region and at least a portion of the first insulating layer, wherein the field plate is connected to the source. A second insulating layer is formed over the field plate layer, first insulating layer and the trench; and a drain electrode electrically coupled to the drain contact region.

In a still further aspect, a method of fabricating a power MOSFET integrated circuit such as the LDMOS device set forth above is disclosed, which involves restricting SCT trench features to linear portions of polysilicon gates. In another embodiment, an edge cell of an array of power MOSFET cells (also referred to as a terminating cell) is fabricated to include an inactive portion wherein the SCT trench and associated source region are not formed, thereby specifically obtaining a non-functional portion in the edge cell. In yet another embodiment involving edge cells with inactive portions, a ground tab may be provided at the die edge in order to ensure that a die edge field plate associated with the inactive portion is at a stable potential during device operation. In a still further related embodiment involving edge cells with inactive portions, the edge cell may have feature geometries that are different from those of other cells of the MOSFET cell array (e.g., interior cells or non-terminating cells).

BRIEF DESCRIPTION OF THE DRAWINGS

Embodiments of the present disclosure are illustrated by way of example, and not by way of limitation, in the Figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing Figures in which:

DETAILED DESCRIPTION OF THE DRAWINGS

Figure 1:
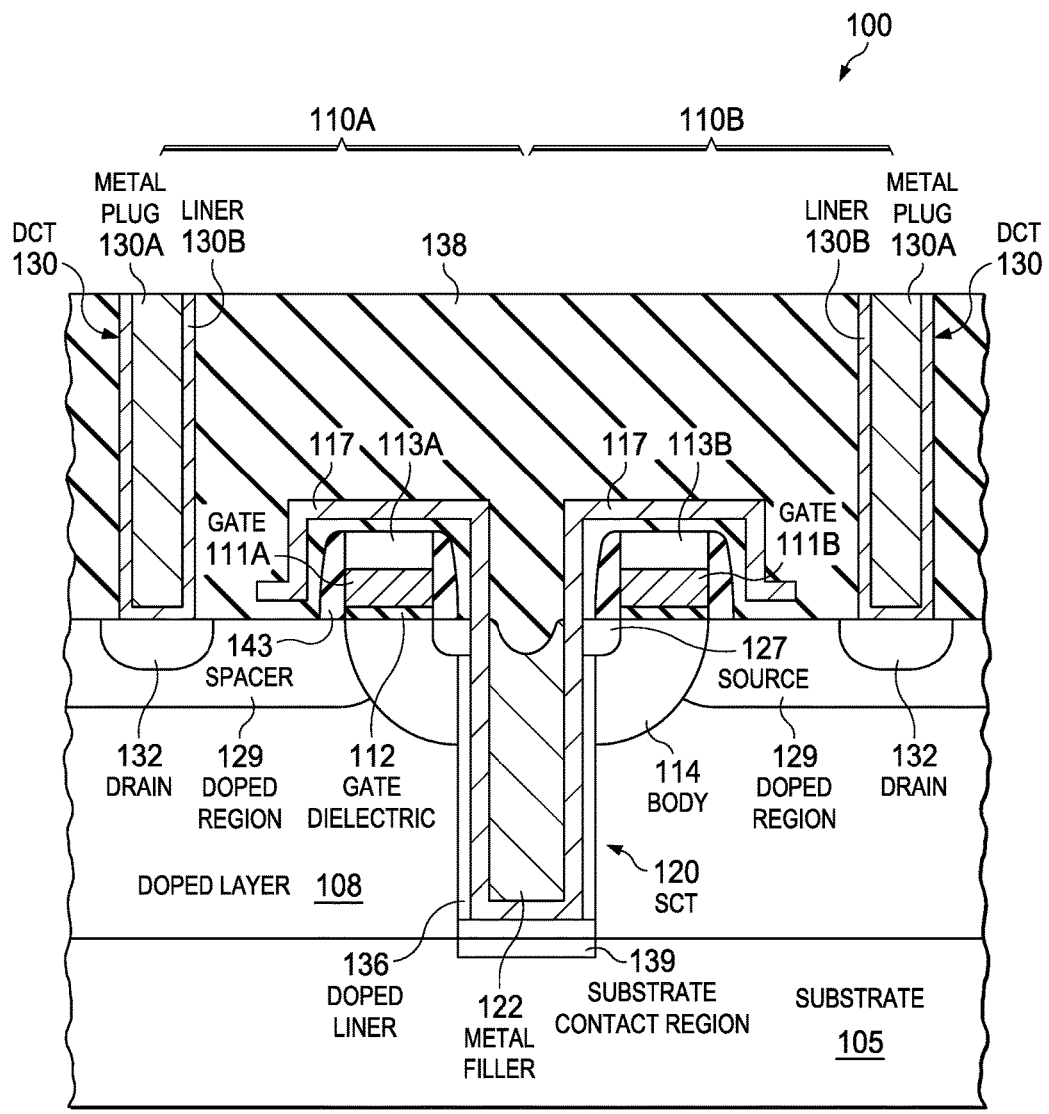
FIG. 1 depicts a cross-sectional view of a portion of an example power MOSFET integrated circuit or device according to an embodiment of the present disclosure.

The present disclosure is described with reference to the attached Figures wherein like reference numerals are generally utilized to refer to like elements throughout. The Figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In the following description, reference may be made to the accompanying drawings wherein certain directional terminology, such as, e.g., "upper", "lower", "top", "bottom", "left-hand", "right-hand", "front side", "backside", "vertical", "horizontal", etc., may be used with reference to the orientation of the Figures or illustrative elements thereof being described. Since components of embodiments can be positioned in a number of different orientations, the directional terminology is used for purposes of illustration and is in no way limiting. Likewise, references to features referred to as "first", "second", etc., are not indicative of any specific order, importance, or the like, and such references may be interchanged mutatis mutandis, depending on the context, implementation, etc. It is understood that further embodiments may be utilized and structural or logical changes may be made without departing from the scope of the present disclosure. The features of the various exemplary embodiments described herein may be combined with each other unless specifically noted otherwise.

As employed in this specification, the terms "coupled", "electrically coupled", "connected" or "electrically connected" are not meant to mean that elements must be directly coupled or connected together. Intervening elements may be provided between the "coupled", "electrically coupled", "connected" or "electrically connected" elements.

Example semiconductor devices described below may include or formed of a semiconductor material like Si, SiC, SiGe, GaAs or an organic semiconductor material. The semiconductor material may be embodied as a semiconductor wafer or a semiconductor chip containing one or more power MOSFET integrated circuits, input/output and control circuitry, as well as microprocessors, microcontrollers, and/or micro-electro-mechanical components or systems (MEMS), and etc. The semiconductor chip may further include inorganic and/or organic materials that are not semiconductors, for example, insulators such as dielectric layers, plastics or metals, and etc.

Referring now to the drawings and more particularly to FIG. 1, depicted therein is a cross-sectional view of a portion of an example power MOSFET device 100 according to an embodiment of the present disclosure wherein one or more layout design innovations may be implemented for overcoming certain issues relative to fabricating semiconductor devices having high aspect ratio features such as deep source contact trenches. The power MOSFET device 100 may be implemented in an integrated circuit (IC) die. By way of illustration, example power MOSFET device 100 is shown as a planar gate power MOSFET device having a metal-filled deep source contact (SCT) 120 that may be formed in a trench of a semiconductor substrate. In an example implementation, deep source contact 120 may be formed as a metallic plug comprising a refractory metal filler 122, which may include a platinum-group metal (PGM) that connects a source region 127 formed in a body 114 of a power MOSFET cell portion 110A and/or 110B to a substrate contact region 139. In one example embodiment, Tungsten may be used as a refractory metal filler 122. One identifying feature of refractory metals is their respective resistance to heat, where the five industrial refractory metals (Molybdenum (Mo), Niobium (Nb), Rhenium (Re), Tantalum (Ta) and Tungsten (W)) all have melting points in excess of 2000° C., with Tungsten having a melting point of 3422° C. Example PGMs include Iridium (Ir), Osmium (Os), Palladium (Pd), Platinum (Pt) and Rhodium (Rh), with Pt and Pd have melting points of 1769° C. and 1554° C., respectively. The melting points may be compared to Aluminum (Al) (not a refractory metal or a PGM) which has a melting point of only 660° C., which is thus not ideal for forming a metal filler for a disclosed metal filled deep SCT 120.

In one example embodiment, power MOSFET 100 includes a doped layer 108 positioned near the top surface of the substrate 105. The doped layer 108 may be developed as an epitaxial (epi) layer or formed by ion implantation. As previously noted, the substrate 105 and/or doped layer 108 can comprise silicon, silicon-germanium, or other semiconductor material. In certain additional or alternative embodiments, however, MOSFET 100 can be formed directly on a substrate 105, such as a substrate comprising bulk silicon with an appropriate doping species and concentration. In one implementation, the doped layer 108 is an epitaxial layer 108 that is lightly doped and has a layer thickness designed to increase the device breakdown voltage, on a more heavily doped substrate 105.

Accordingly, in an embodiment of the present disclosure, power MOSFET 100 may be considered as a semiconductor structure having a doped substrate, e.g., substrate 105, having bottom and top surfaces and a doped layer (e.g., epi 108) positioned adjacent to the top surface and having an upper surface, wherein source and drain regions of a first conductivity type may be formed in the doped layer proximate the upper surface of the doped layer, the source and drain regions being spaced from one another and separated by a channel region of a second conductivity type formed in the doped layer, the channel region having a portion extending under the source region, and further wherein the drain region formed in a doped region 129 adjacent to the channel region formed in a body 114. In one example implementation, doped region 129 comprises a lightly doped drain (LDD) having a concentration that is lighter than a drain region 132.

In an example MOSFET IC 100, the drain region 132 may be provided with a drain contact (DCT) 130. The DCT 130 includes a metal plug 130A with a barrier metal liner 130B. In one implementation, the barrier metal liner 130 includes titanium and/or titanium nitride (Ti/TiN). Laterally surrounding a portion of the deep SCT 120, a source region 127 is coupled to the deep SCT 120. The source region 127 is generally formed by ion implantation. The deep SCT 120 provides a low resistance contact to the source region 127 by virtue of the metal filler 122. The deep SCT 120 connects the source 127 to the epi layer 108 or substrate 105 via a highly doped substrate contact region 139 (doped p+ for P-type substrates) at a bottom of the deep SCT 120 (optionally through a thin region of epi layer 108) so that during operation when the power MOSFET 100 is turned ON, current can flow vertically down and out the back of the substrate 105 (i.e., semiconductor die) with low resistance (in an example source-down implementation).

To the external circuitry, accordingly, the backside of the substrate 105 is generally operative as the source pin. The topside metal (that will be on top of the dielectric layer(s) 138 and coupled to a drain contact through the dielectric layer 138 to the drain 132) is operative as the drain pin. As noted above, at the bottom of the deep SCT 120 is a substrate contact region 139 that is generally an implanted region formed after the etching of the trench for the deep SCT 120, which may be doped the same type as the epi layer 108. In an illustrative fabrication flow, the boron doping level for substrate contact region 139 can be around $1 \times 10^{20}$ cm$^{-3}$ (for example, $5 \times 10^{19}$ cm$^{-3}$ to $1 \times 10^{21}$ cm$^{-3}$) to provide a low resistance ohmic contact to the substrate 105.

Continuing to refer to FIG. 1, it should be appreciated that two individual power MOSFET devices 110A and 110B are shown forming a cell that can function as a building block of a power MOSFET device, each device being defined from the midpoint of the deep SCT 120 to the midpoint of the DCT 130 in this example arrangement shown in FIG. 1. However, a skilled artisan will recognize that a practical power MOSFET device may be considered a 2D transistor array, as there may be hundreds or thousands of individual active MOSFET cells coupled together electrically in parallel and an example cell may be defined from the midpoint of one SCT to the midpoint of the next SCT. Accordingly, a 2D transistor array to form an example power MOSFET device is generally built up in circuit design by repetitive mirror images of a unit cell comprising two devices 110A, 110B coupled to each other by a common SCT or a common DCT, depending on how a repeating cell is defined.

Individual power MOSFET devices 110A/110B also include respective gate electrodes or gate stacks, e.g., gates 111A, 111B, formed over a suitable gate dielectric layer 112. Additionally or alternatively, an optional silicide layer 113A/113B may be provided as part of the gate stack of a MOSFET device. Regardless of whether a multi-layer stack arrangement is implemented, an insulating layer (e.g., a first insulating layer 143 forming a spacer over the sidewall surfaces and extended over a top surface of the stack) may be provided as a dielectric barrier. Further, the gate/stacks 111A/113A and 111B/113B of the MOSFETs 110A/110B are separately electrically tied together by another metal or doped polycrystalline element (not shown in this FIG.), which may be generally connected to the gate electrode terminal of the device package. As the transistor cell array is generally built up by repetitive mirror images of this unit cell, it will be appreciated that one DCT 130 shares two gates on either side, just as one deep SCT 120 shares two gates on either side, as shown in the example arrangement of FIG. 1.

A source field plate 117 may be provided as an extension of the deep SCT structure 120 to operate as a source metal wrapping or extension adjacent to the respective gate electrodes of the power MOSFET devices 110A/110B. In one example implementation, source field plate (FP) 117 may comprise a refractory metal material layer or refractory metal material layer stack, formed of materials such as, e.g., TiN/Ti, tungsten, Ti-tungsten (Ti—W), and etc. In some embodiments, the refractory metals may be provided in combination with polysilicon-based materials or stacks. Additionally, such refractory metal materials may also be provided at the bottom of the deep SCT 120. In an example fabrication flow, a rapid thermal anneal (RTA) step can be performed after TiN/Ti deposition, which leads to titanium silicide formation at the Ti/Si interface in an embodiment having for a silicon epi layer 108. This formation of metal silicide can also facilitate a good ohmic contact between the deep SCT 120 and the epi layer 108 (or substrate 105).

Still continuing to refer to the cross-sectional view of FIG. 1, fabrication of an example power MOSFET device 100 may include forming one or more dielectric layer(s) 138 above the gate stacks 111A/113A and 111B/113B as well as surrounding and/or overlying FP 117. Typically, such dielectric layers 138 may comprise a dielectric stack formed of one or more deposited silicon oxide layers (e.g., Tetraethyl Orthosilicate (TEOS) derived, boron and phosphorous doped TEOS (BPTEOS)/TEOS) layers), which may be based on standard interlevel dielectric processing (deposition/lithography/etching).

In one example implementation, a tilted implant step may also be provided that facilitates tilted implant of appropriate species into the sidewall region of the SCT trench 120 to form a doped liner 136 prior to the formation of the metal filler 122. One skilled in the art will recognize that such a tilted implant may help reduce the resistance between the body region 114 (e.g., P-doped) and the substrate 105 or epi layer 108. The tilted trench implant utilizes a first conductivity type, e.g., p-type for power MOSFET device 100 that is exemplified as an NMOS device. Typically, the implant parameters for a tilted implant including boron may comprise a dose range from $1 \times 10^{14}$ to $5 \times 10^{15}$ cm$^{-2}$, an energy range from 20 keV to 60 keV, and an angle range from 5 to 25 degrees.

Skilled artisans will appreciate that disclosed MOSFETs have a form that resembles an LDMOS (Laterally Diffused MOSFET) structure, which in some embodiments may be implemented as an asymmetric power MOSFET designed for low on-resistance and high blocking voltage. As used herein, an LDMOS device may be deemed synonymous with a diffused metal oxide semiconductor (DMOS) device. Besides Tungsten (W), the metal filler 122 may also comprise other refractory metals such as Ta, or a PGM such as Pt or Pd, their metal silicides, or metal alloys of such metals including Ti—W.

Although NMOS transistors are generally described herein, it should be clear to one having ordinary skill in the art to use the disclosure of the present patent application to also form PMOS transistors, by n-doped regions being substituted by p-doped regions and vice versa, with resulting structures being roughly analogous. For example, differences in disclosed NMOS vs. PMOS power MOSFET devices may involve using opposite types of doping, e.g., a P/P+ substrate for NMOS becomes an N/N+ substrate for PMOS, the source and drain regions being changed from N-type doping for NMOS to P-type doping for PMOS, and the body region being changed from P-type for NMOS to N-type for PMOS. Furthermore, whereas an N-channel MOSFET cell structure including a source-down enhancement mode transistor is exemplified in FIG. 1 for the individual power MOSFET devices, one skilled in the art having reference to this patent application will appreciate that P-channel devices and/or drain-down architectures may also be utilized with appropriate polarity changes in a power MOSFET implementation, mutatis mutandis, according to the teachings herein.

One skilled in the art will recognize that the deep SCT structure 120 of the disclosed power MOSFET 100 is arranged to ohmically contact the source region and the substrate of the device, which may be doped with opposite types of species relative to each other. Further, the metal (e.g., W) filled deep SCT is recognized to reduce the SCT parasitic resistance as well as the area-normalized ON state resistance ($R_{SP}$) of the power FET. As noted elsewhere, the deep SCT trench structure 120 generally has a high aspect ratio (AR), for example, having a 0.2-0.4 μm critical dimension (CD) opening between gate stacks 111A/113A and 111B/113B that provide self-alignment for the source, with a depth of 1.0 μm (including the gate stack) or more. Accordingly, in some embodiments, the AR of the deep SCT 120 may be 5:1 or more. In some other embodiments, deep SCT 120 may have an opening of 0.4 μm and a depth of 1.2 μm (including the gate stack thickness), thereby resulting in an AR of 3:1. One skilled in the art will therefore recognize that various other AR combinations may be obtained depending on semiconductor process and fabrication flows.

Providing trench ARs having ranges of interest (e.g., at least 2:1 to 5:1 in certain embodiments) in an example fabrication flow is recognized herein to result in significant challenges for a metal fill and etch process that may be used in fabricating deep SCT structures. Example challenges in fabricating deep SCT trenches with high AR values using metal fill and etch back processing may include formation of metal residue or particulates over the field plate structures (e.g., FP 117). As one skilled in the art can appreciate, such metal residue particulates can cause leakage or shorting between the source (as it is connected to the FP) and the drain contact. Further, formation of metal seams (or, void regions) in the SCT can add to the parasitic resistance, thereby resulting in increased $R_{SP}$. Additionally, SCT trenches with deep recess requirements may not be opened properly or consistently due to inherent process variations in the metal fill and etch back operations across the die/wafer comprising the power MOSFET cell arrays. Still further, there is a cell asymmetry in the layout of SCT/polysilicon gate at the edge of a power MOSFET array (i.e., peripheral region of the cell array), which results in poor Ti/TiN coverage at the Si corner in the subsequent FP deposition process. Such issues have been recognized as not only causing a reduction in an example process flow's robustness but also negatively impacting the yield due to parametric losses (e.g., losses due to $I_{DSS}$ failures, wherein $I_{DSS}$ is referred to as the drain current for zero bias for a FET).

An example power MOSFET process flow that may encounter some of the issues described above may be set forth herein as an illustrative semiconductor process environment for purposes of providing a reference process flow with respect to an embodiment of the present disclosure. For instance, a metal filler deposition/etch back process flow for planar gate power MOSFET fabrication may commence with a semiconductor wafer comprising a P-epi layer on P+ bulk silicon substrate. A gate electrode comprising $WSi_2$ as the silicide layer on polysilicon may be formed as the gate electrodes for a MOSFET cell of two adjacent MOSFET devices (e.g., devices 110A and 100B described hereinabove). In one implementation, a gate dielectric comprising 175 Angstroms (Å) of silicon oxide ($SiO_2$) may be formed over the substrate. A trench about 1.5 μm deep including a 0.5 μm tall gate stack, with a trench opening CD of about 0.3 μm may be formed, which may be lined with FP material comprising 800 Å of TiN on 600 Å of Ti. Whereas such a Ti/TiN layer may be extended into the deep SCT to coat its sidewalls, the TiN/Ti material by itself may not be sufficient to provide a low resistance path from the source 127 to the doped layer 108 or substrate 105. The deep SCT 120 may be filled with a Tungsten (W) deposition (e.g., by way of a chemical vapor deposition or CVD process). Subsequent tungsten etchback etch processing may comprise a 3-step plasma etch in an example process flow implementation, with the process gas comprising $SF_6/O_2/N_2$, a pressure of 30 mtorr to 35 mtorr, a plasma source power being 650 W~800 W, bias power 25-35 W, with the temperature of the chamber wall being about 50° C. and the temperature of the electrostatic chuck (ESC) being about 30° C. In one example process flow, various etch parameters may be provided with a tolerance of at least 10%. Additional details relating to metal filler deposition/etch back process flow for fabricating power MOSFETs may be found in the commonly assigned co-pending U.S. patent application Ser. No. 15/171,136, dated Jun. 2, 2016, incorporated by reference herein.

To overcome at least some of these issues, novel SCT layout design innovations are set forth herein that may be practiced in various combinations, thereby giving rise to multiple embodiments. Broadly, in one aspect, the length of a SCT layout feature (e.g., a horizontal dimension along the top surface of the substrate) is restricted such that it does not extend beyond a poly gate curvature area, wherein the SCT is aligned to a complementary contour (i.e., a linear portion) of the poly gate. Accordingly, in this aspect, the actual SCT width in a power MOSFET device or cell is determined by the gate-to-gate space (including the spacer width where a gate spacer is provided), rather than the SCT layout dimension as required in an arrangement where the SCT layout extended beyond the poly gate curvature area. With the disclosed approach of restricting an SCT layout feature to a linear portion of the poly gate feature, effects of non-uniformity in processing may be alleviated as will be described in further detail below. In another aspect, cell array edge asymmetry in poly/SCT layout is removed so as to ensure that all SCT trenches are between two poly gates, thereby ascertaining that all SCT Si corners (including those formed in the cells of the array periphery) will have the same profile and thus have a uniform Ti/TiN coverage. In yet another aspect, a ground tab may be provided at the die edge in order to ensure that the die edge field plate is at a stable potential during device operation since the cell edge poly/SCT layout asymmetry may have been removed in an embodiment. These various aspects will be described in additional detail hereinbelow, recognizing that not all embodiments of the present disclosure require each and every design innovation aspect in practice of the present disclosure.

Figure 2:
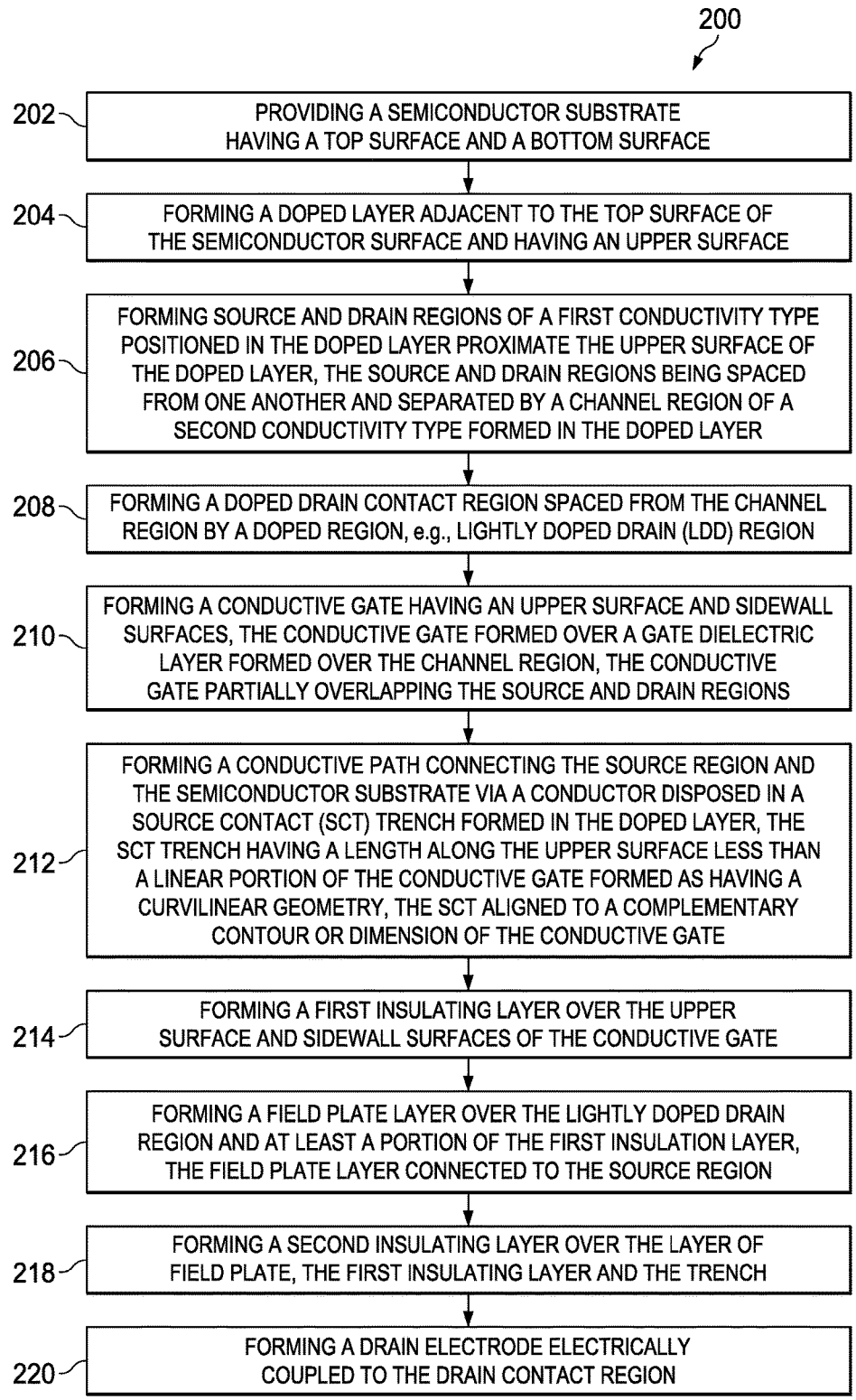
FIG. 2 is a flowchart associated with a method of fabricating a power MOSFET integrated circuit according to an embodiment of the present disclosure.

FIG. 2 is a flowchart associated with a method 200 of fabricating a power MOSFET integrated circuit according to an embodiment of the present disclosure. At block 202, a semiconductor substrate having a top surface and a bottom surface is provided, in which a doped layer having appropriate species and concentration may be formed adjacent to the top surface of the semiconductor surface and having an upper surface (block 204). Source and drain regions of a first conductivity type positioned in the doped layer proximate the upper surface of the doped layer may be formed, the source and drain regions being spaced from one another and separated by a channel region of a second conductivity type formed in the doped layer (block 206). In one implementation, the channel region may be provided with a portion extending under the source region, wherein the drain region may comprise a portion formed in a suitably doped region (e.g., a lightly doped drain (LDD) region) formed adjacent to the channel region. A doped drain contact region may be formed such that it is spaced from the channel region by the lightly doped drain region (block 208). A conductive gate having an upper surface and sidewall surfaces may be formed over a gate dielectric layer formed on the channel region, wherein the conductive gate may partially overlap the source and drain regions (block 210). A conductive path is formed for connecting the source region and the semiconductor substrate via a conductor disposed in an SCT trench formed in the doped layer and extended into a substrate contact region in the semiconductor substrate. The SCT trench is provided with a length, e.g., longer of the two dimensions along an upper surface of the doped layer (or, along the top surface of the semiconductor substrate in an embodiment without the doped layer), that is less than a linear portion of the conductive gate formed as having a curvilinear geometry (block 212). It should be appreciated that the length of the conductive gate's linear portion being referred to herein is the length of the layout feature corresponding to the conductive gate in a top plan view rather than an electrical "channel gate length," commonly used in reference to a cross-section of a MOSFET device. A first insulating layer is formed over the upper surface and sidewall surfaces of the conductive gate (block 214), whereupon a field plate layer having suitable metallurgical properties is formed over the lightly doped drain region and at least a portion of the first insulating layer, wherein the field plate layer is connected to the source region and SCT (block 216). A second insulating layer is formed over the layer of field plate, first insulating layer (e.g., not covered by the field plate layer) and the trench (block 218). A drain electrode electrically coupled to the drain contact region is formed to complete the power MOSFET integrated circuit fabrication (block 220).

Figure 3A:
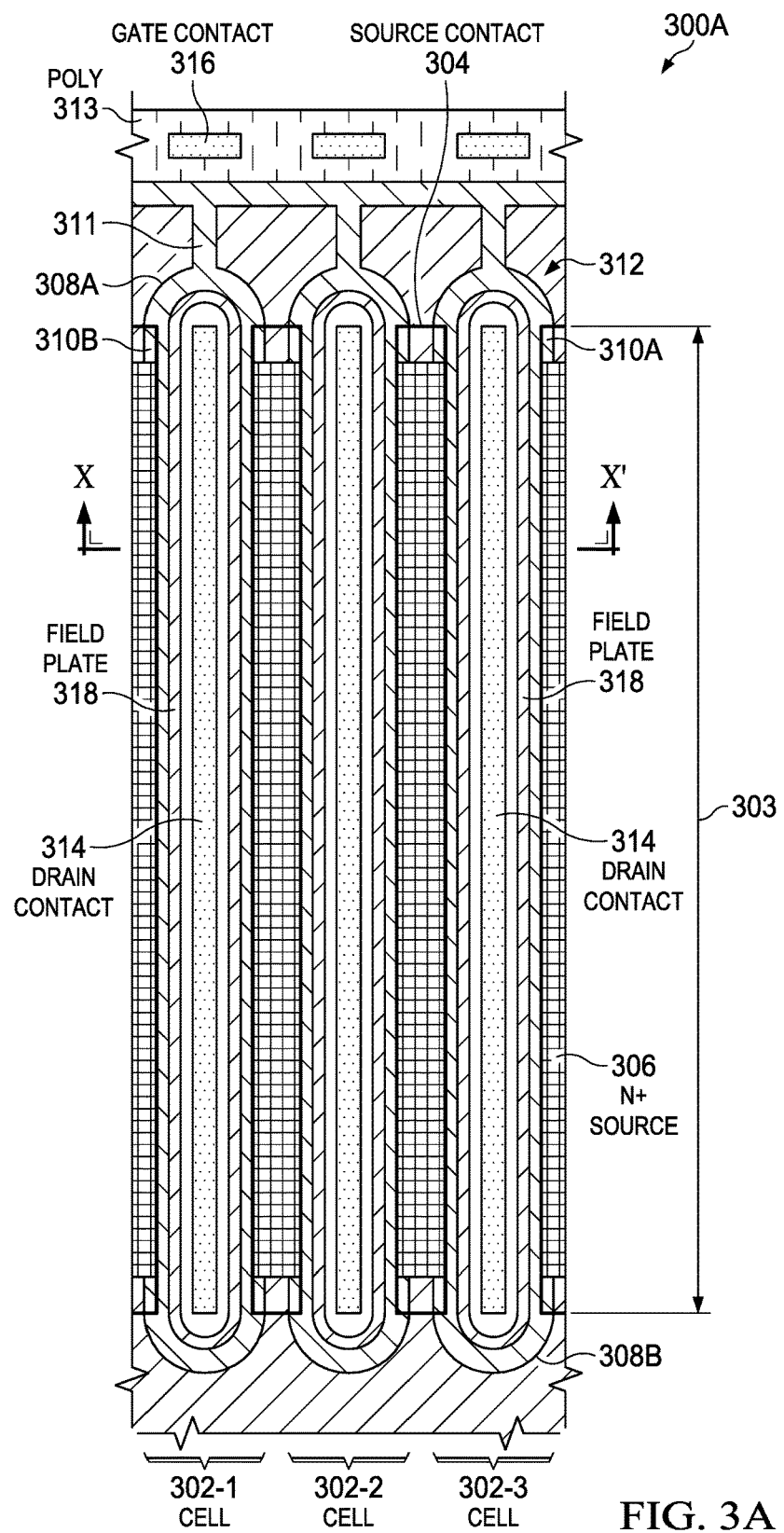
FIGS. 3A-3C depict layout diagrams of example power MOSFET cells according to one or more embodiments of the present disclosure.
Figure 3B:
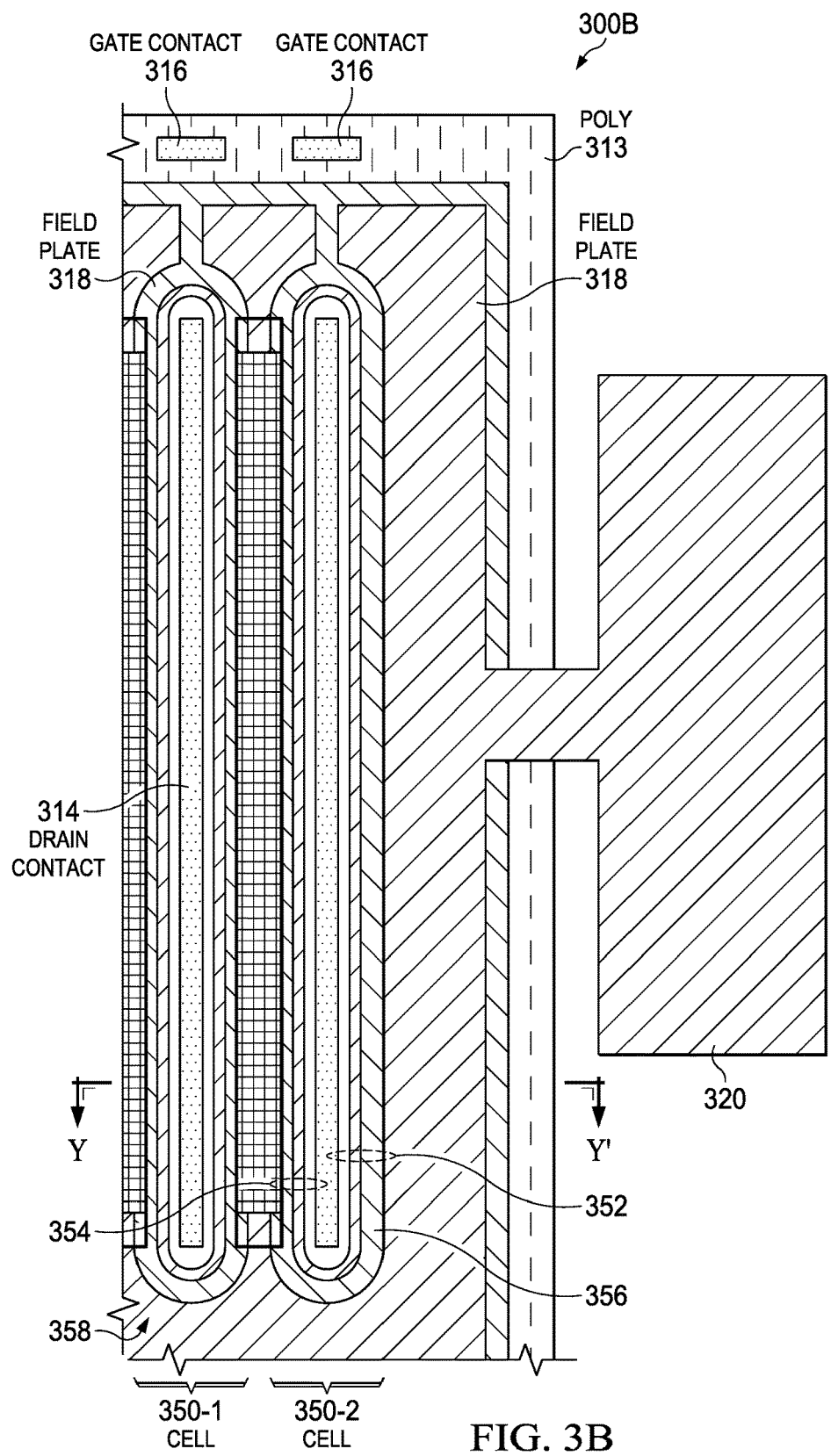
Figure 3C:
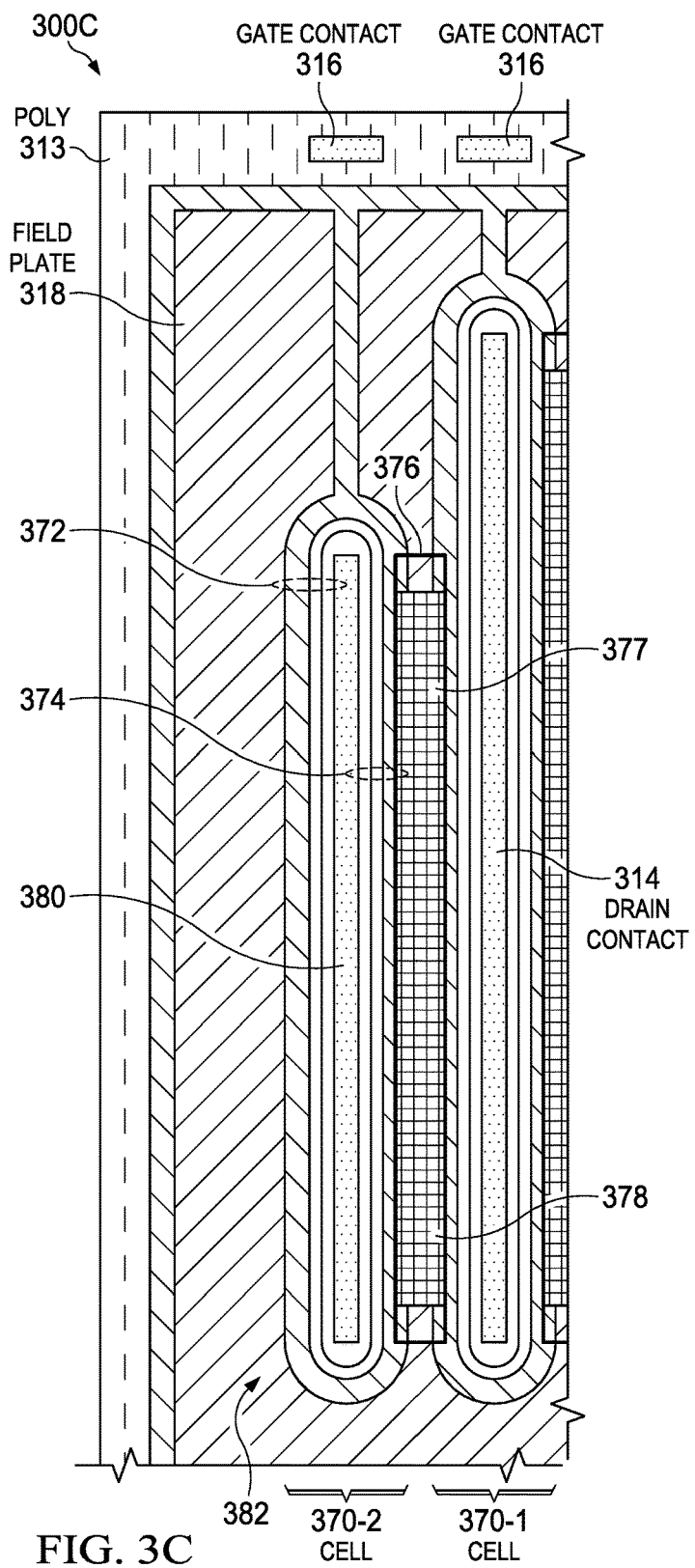

FIGS. 3A-3C depict layout diagrams of example power MOSFET cells in top plan view according to one or more embodiments of the present disclosure. Reference numeral 300A in FIG. 3A refers to an interior region of an array of power MOSFET cells of an IC or die. Layout of three repeating cells 302-1, 302-2, 302-3 contiguously disposed in the interior region is illustrated, which may be referred to as interior cells, wherein each interior cell comprises two adjacent MOSFET devices as described in detail hereinabove. By way of illustration in particular reference to cell 302-2, a common drain contact 314 is provided between a pair of interior MOSFET devices (shown in detail in a cross-sectional view of FIG. 4A), which are coupled to each other at the common drain contact 314. A polysilicon gate feature 312 is provided as a forked structure (e.g., as a closed-ended tuning fork or racetrack, etc.) having an extension 311, wherein two linear portions 310A, 310B emanating from the extension 311 form the racetrack or a closed fork, which linear portions 310A/310B (referred to as "fingers" or "prongs" or terms of similar import), are operative as respective gates for the two MOSFET devices of cell 302-2. Accordingly, it will be seen that an example polysilicon gate feature 312 may comprise a curvilinear layout geometry formed of two substantially parallel linear portions 310A, 310B that are connected at each end with substantially semicircular or arcuate portions 308A, 308B, wherein extension 311 forms a connection to a polysilicon boundary or margin 313 of the MOSFET IC device that includes gate contacts 316.

Figure 4A:
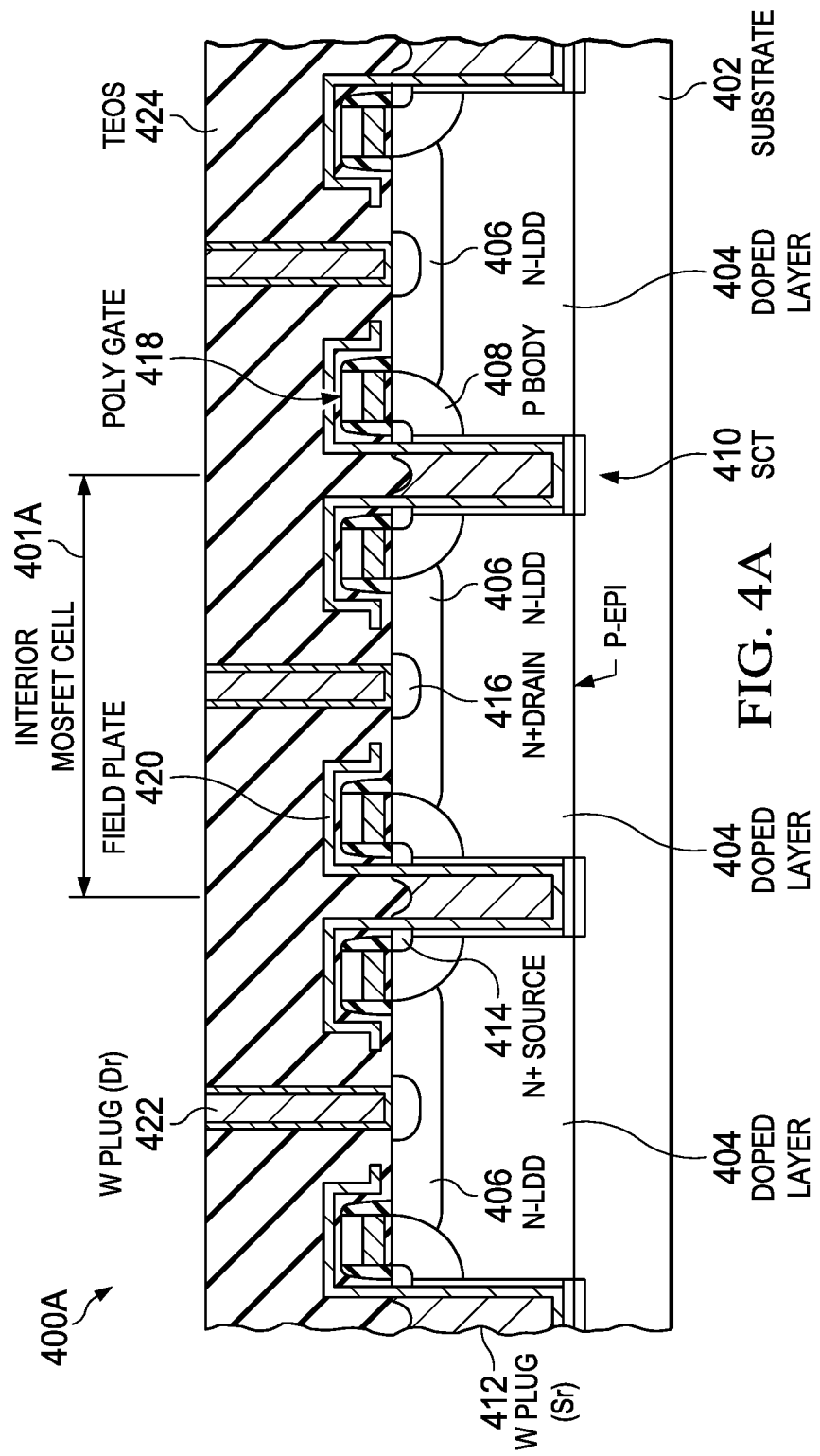
FIG. 4A depicts a cross-sectional view of an interior power MOSFET cell layout shown in FIG. 3A according to an example embodiment of the present disclosure.
Figure 4B:
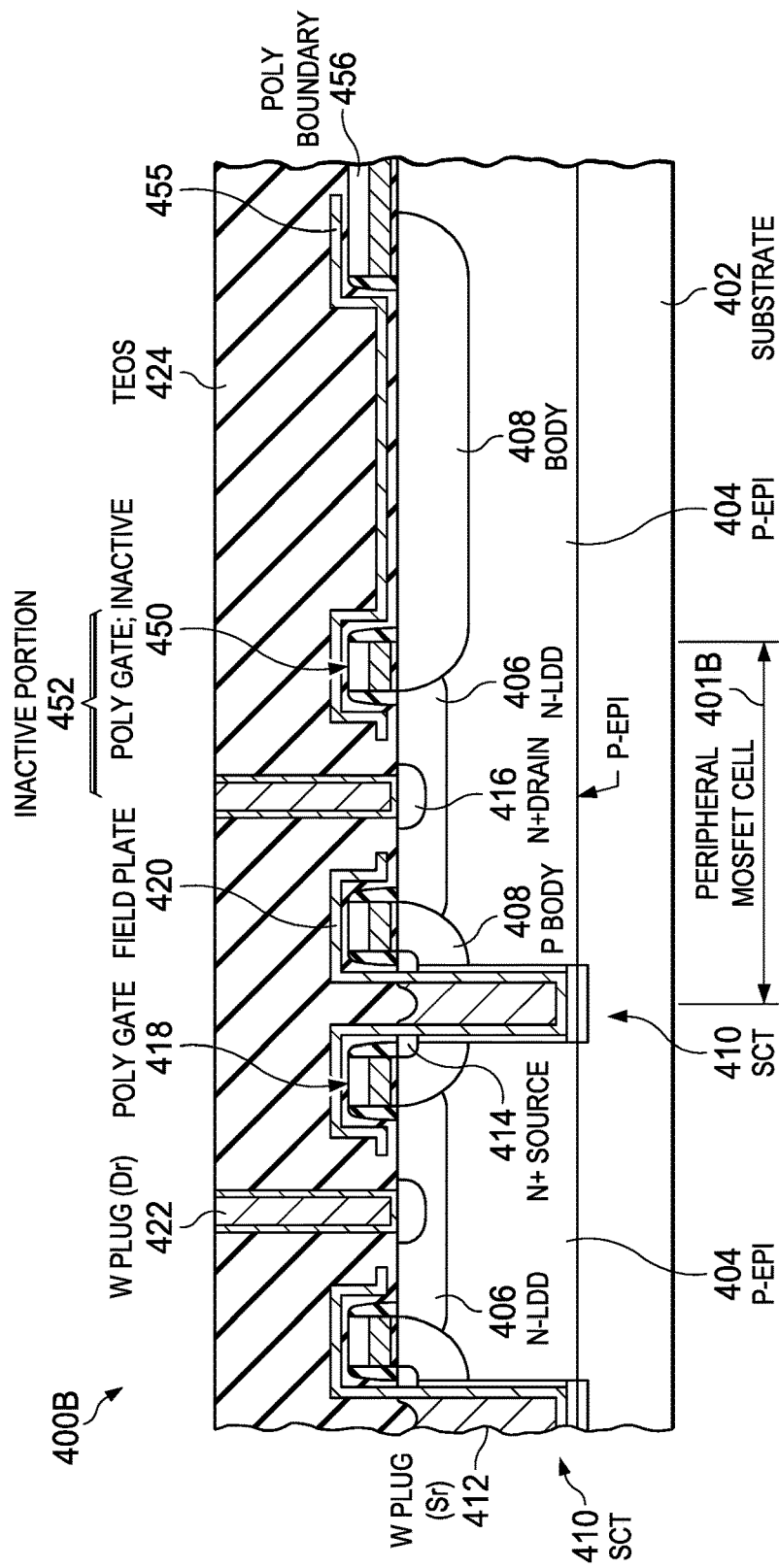
FIG. 4B depicts a cross-sectional view of a peripheral power MOSFET cell layout shown in FIG. 3B according to an example embodiment of the present disclosure.

In accordance with the teachings of the present patent application, a substantially rectangular source contact (SCT) trench feature 304 having a length 303 less than a linear portion of the polysilicon gate (e.g., length portions or fingers 310A/310B) of the interior MOSFET device is provided for defining a source contact conductor with respect to a source region 306, wherein the SCT trench 304 is self-aligned to the gate (i.e., the SCT trench is aligned to a complementary contour or dimension of the gate). As one skilled in the art will appreciate, because of the repeating pattern of MOSFET cells in an array, SCT trench 304 and associated source region 306 are operative as a source terminal for one of the MOSFET devices of the interior cell 302-2 and for a contiguous MOSFET device of the adjacent cell 302-3, similar to the cross-sectional arrangement shown in FIG. 1 described above in detail. Similar cross-sectional views are also illustrated in FIGS. 4A and 4B, which will be set forth hereinbelow.

In one arrangement, SCT trench 304 may be short of a particular distance from both end cap curved portions 308A, 308B of the example polysilicon gate feature 312 (i.e., SCT trench's length is restricted or confined to the linear portions of the gate feature by some distance), thereby ensuring that the SCT trench feature does not extend beyond each end cap curved portion. In another arrangement, SCT trench 304 may be restricted at one end but not the other. In a still further arrangement, SCT trench 304 may be pulled back from respective end cap curved portions 308A, 308B of the example polysilicon gate feature 312 by different distances (e.g., a terminus of SCT trench 304 may fall short of end cap curved portion 308A by a distance that is different than the distance by which the opposite terminus of SCT trench 304 it is restricted relative to the other end cap curved portion 308B). One skilled in the art will readily recognize that several variations of SCT trench feature restriction vis-à-vis end cap curved portions 308A, 308B of the example polysilicon gate feature 312 may be obtained within the scope of the present disclosure. Regardless of the variations in SCT trench formation, an FP layer 318 may be provided for covering over the polysilicon gate features, SCT trench features as well as channel and doped regions of the various MOSFET cells 302-1 to 302-3 regions in a manner set forth previously.

Because the SCT trench feature 304 is restricted to the linear portions 310A, 310B of the polysilicon gate feature 312, the actual cell area SCT width is determined by the gate-to-gate space (including any spacers) between two adjacent cells, e.g., cells 302-2 and 302-3, rather than by SCT trench layout dimensions that can extend out beyond the curved portions in conventional process flows. As has been noted elsewhere in the present patent application, such extended SCT trench features are prone to non-uniform processing across the die, causing various process defects and concomitant yield reduction, particularly where high ARs are desired for the SCT structures.

Turning to FIG. 3B, reference numeral 300B refers to an outer edge or peripheral region of a power MOSFET cell array, which may include an interior region having interior cells described above. Preferably, the peripheral region includes a last MOSFET cell 350-2 next to a MOSFET cell 350-1 that is similar to the interior cells. Whereas MOSFET cell 350-1 may have an identical cell structure as the interior cells 302-1 to 302-3, edge MOSFET cell 350-2 (also synonymously referred to as a terminating cell, edge cell, or a peripheral cell, or terms of similar import) may comprise one fully formed MOSFET device 354 disposed adjacent to an inactive circuit portion 352 (i.e., a partially formed portion) that contains no SCT trench formation or source region. In other words, the inactive circuit portion 352 comprises a region devoid of a source terminal although a regular polysilicon gate portion 356 may be provided as one branch of a forked polysilicon gate feature 358 formed similar to the polysilicon gate features 312 of the interior MOSFET cells. In addition, a shared drain contact 314 similar to the drain contacts 314 of the interior MOSFET cells may also be disposed between the functional MOSFET device 354 and adjacent non-functional portion 352 of the terminating cell 350-2. Likewise, a field plate layer 318 may also be provided for the functional MOSFET device 354 and adjacent non-functional portion 352 of the terminating cell 350-2 in a similar manner, which may be extended over to cover the polysilicon boundary 313.

It will be appreciated that by providing a terminating cell arrangement different from the interior cells of a MOSFET IC device, it can be ascertained that all SCT trench features are disposed between two polysilicon gate features. Accordingly, it can ensured that all SCT/polysilicon corners have the same profile and same FP coverage (e.g., Ti/TiN coverage). As noted previously, such an arrangement can help ensure uniform processing across the device, thereby reducing process weaknesses that can be caused by non-self-aligned source contact side (e.g., such as voiding and thinning of barrier layer).

A further variation of an example peripheral region 300C of a MOSFET IC device is shown in FIG. 3C wherein a terminating cell 370-2 may have feature geometries that are different from those of an adjacent cell 370-1 which may be identical to interior cells such as, e.g., cells 302-1 to 302-3. By way of illustration, terminating cell 370-2 is provided as a cell that is shorter than its adjacent cell 370-1, with correspondingly shorter drain contact 380, shorter polysilicon gate feature 382, as well as shorter SCT contact feature 376 and associated source region 377. Accordingly, a peripheral cell such as cell 370-2 may include a MOSFET device 374 having a polysilicon gate of a second length that is less than the length of the polysilicon gate of the interior MOSFET devices. Further, Similar to the terminating cell arrangement 350-2 of peripheral region 300B illustrated in FIG. 3B, terminating cell 370-2 may be provided with a non-functional circuit portion 372 adjacent to a functional MOSFET device 374 in the embodiment shown in FIG. 3C. In a still further embodiment, SCT contact feature 376 may be restricted to a linear portion of the polysilicon gate feature 382, in a manner similar to the embodiment of FIG. 3A.

In a still further aspect, a ground tab may be provided in either of the embodiments of FIGS. 3B and 3C in order to ensure that the field plate at the die/device edge is at a stable potential during device operation since the non-functional circuit portion 352 (in FIG. 3B) and non-functional circuit portion 372 (in FIG. 3C) are devoid of source trench formation and associated source region (which are maintained at a known potential in interior cells, e.g., $V_{SS}$, during device operation). As an illustration, a ground tab 320 is shown as coupled to the FP layer 318 in the embodiment of FIG. 3B. Likewise, a similar ground tab arrangement may be provided in the embodiment of FIG. 3C. It should be apparent that the number, shape, size and location of ground tabs may be variable, depending on the requirements of a particular fabrication process.

FIG. 4A depicts a cross-sectional view 400A of interior power MOSFET cell layout shown in FIG. 3A taken along X-X'. Interior MOSFET cell 401A is representative of cross-sectional views of cells 302-1 to 302-3 as well as cells adjacent to terminating cells in certain embodiments. FIG. 4B depicts a cross-sectional view 400B including a peripheral/terminating MOSFET cell 401B, taken along Y-Y'. It will be apparent to one skilled in the art that views 400A and 400B collectively may represent a cross-sectional view of a power MOSFET IC device or die, with an interior region or portion illustrated by view 400A and an edge or peripheral portion illustrated by view 400B. In both views 400A, 400B, a substrate 402 having a doped layer 404 (e.g., P-epitaxial layer) supports a doped region 406 as described previously in reference to FIG. 1. An N+ source 414 is formed in a P-type body 408 adjacent to SCT 410 that is filled with a W plug 412. An N+ drain 416 defined in doped region 406 is contacted by a drain plug 422. A polysilicon gate 418 overlapped by oxide insulation (not specifically labeled) is covered by a field plate 420. The entire cell array may be covered by a protective oxide layer such as TEOS 424, with the drain plugs being exposed for electrical contacting. In the terminating cell 401B, a non-functional circuit portion 452 is exemplified by an inactive polysilicon "gate" 450 that is overlain by a field plate 455 extending to and over a boundary polysilicon region 456. As described previously, the non-functional circuit portion 452 is devoid of a source and associated SCT trench required of a functional MOSFET device.

Below tables set forth illustrative yield enhancements obtained by implementing innovative SCT design aspects described above:

TABLE 1

(Without Innovative SCT Design Features)

| LOT-ID | Failure Bin | Yield Loss |
|---|---|---|
| LOT-1 | $I_{DSS}$ | 5.40% |
| LOT-2 | $I_{DSS}$ | 6.90% |
| LOT-3 | $I_{DSS}$ | 17.04% |

TABLE 2

| (With Innovative SCT Design Features) | | |
|---|---|---|
| LOT-ID | Failure Bin | Yield Loss |
| LOT-A | $I_{DSS}$ | 1.20% |
| LOT-B | $I_{DSS}$ | 1.33% |
| LOT-C | $I_{DSS}$ | 1.20% |

One skilled in the art will appreciate that yield losses due to $I_{DSS}$ parametric failures have significantly improved in the splits with wafers processed according to the SCT layout features as set forth in the present patent disclosure.

Based on the foregoing description, skilled artisans will recognize that embodiments disclosed herein advantageously provide various SCT layout features that facilitate uniform processing of silicon trenches where gate stack topography is present in a MOSFET cell array. In one implementation, an embodiment of the present disclosure eliminates features in which the trench boundary is defined by a photoresist edge only (e.g., SCT extensions beyond the curved portions of a curvilinear polysilicon gate structure). As all trenches are defined by a self-aligned gate or spacer oxide formed around the gates, better process control may be achieved in power MOSFET process flows, especially those optimized for achieving a trade-off between the breakdown voltage ($BV_{DSS}$) and specific on-state resistance ($R_{SP}$) in a variety of power applications.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. An integrated circuit (IC), comprising:
   a semiconductor substrate having a top surface and a bottom surface; and
   at least one metal-oxide-semiconductor field effect transistor (MOSFET) cell formed in the semiconductor substrate, the MOSFET cell comprising a pair of MOSFET devices coupled to each other at a common drain contact, wherein at least one MOSFET device includes a source contact (SCT) trench extended into a substrate contact region in the semiconductor substrate proximate to the bottom surface, the SCT trench having a length along the top surface less than a linear portion of a polysilicon gate of the at least one MOSFET device, the SCT trench aligned to a complementary contour of the polysilicon gate having a curvilinear layout geometry.

2. The IC as recited in claim 1, further comprising an array of MOSFET cells, wherein a peripheral cell of the array comprises a peripheral MOSFET device and an inactive circuit portion formed in the semiconductor substrate.

3. The IC as recited in claim 2, wherein the peripheral MOSFET device includes a second polysilicon gate having a second length along the top surface, and the second length shorter than the length of the polysilicon gate of the at least one MOSFET device.

4. The IC as recited in claim 2, wherein the peripheral MOSFET device includes a second polysilicon gate having a second length along the top surface, and the second length same as the length of the polysilicon gate of the at least one MOSFET device.

5. The IC as recited in claim 2, further comprising a ground tab coupled to a field plate of the peripheral MOSFET device.

6. The IC as recited in claim 5, wherein the field plate comprises at least one refractory metal material layer formed of a material selected from the group of titanium, titanium nitride (Ti/TiN), tungsten and Ti-tungsten (Ti—W).

7. The IC as recited in claim 1, wherein the SCT trench has an aspect ratio of at least 2:1.

8. The IC as recited in claim 1, wherein the SCT trench is filled with a metallic plug comprising a refractory metal or platinum-group metal (PGM) filler for forming an electrical contact with a source terminal of the at least one MOSFET device.

9. A laterally diffused metal-oxide-semiconductor transistor (LDMOS) device, comprising:
   a semiconductor substrate having a top surface and a bottom surface, the semiconductor substrate having a doped layer positioned adjacent to the top surface and having an upper surface;
   source and drain regions of a first conductivity type positioned in the doped layer proximate the upper surface of the doped layer, the source and drain regions being spaced from one another and separated by a channel region of a second conductivity type formed in the doped layer, the channel region having a portion extending under the source region, wherein the drain region comprises a lightly doped drain (LDD) region formed adjacent to the channel region;
   a doped drain contact region spaced from the channel region by the lightly doped drain region;
   a conductive gate having an upper surface and sidewall surfaces, the conductive gate formed over a gate dielectric layer formed over the channel region, the conductive gate at least partially overlapping the source and drain regions;
   a conductive path connecting the source region and the semiconductor substrate via a conductor disposed in a source contact (SCT) trench formed in the doped layer and extended into a substrate contact region in the semiconductor substrate, the SCT trench having a length along the top surface less than a linear portion of the conductive gate, the SCT trench aligned to a complementary contour of the conductive gate having a curvilinear geometry;
   a first insulating layer over the upper surface and sidewall surfaces of the conductive gate;
   a field plate layered over the lightly doped drain region and at least a portion of the first insulating layer, wherein the field plate is connected to the source region;
   a second insulating layer over the layer of field plate, the first insulating layer and the trench; and
   a drain electrode electrically coupled to the drain contact region.

10. The LDMOS device as recited in claim 9, wherein the SCT trench has an aspect ratio of at least 2:1.

11. The LDMOS device as recited in claim 9, wherein the field plate comprises at least one refractory metal material layer formed of a material selected from the group of titanium, titanium nitride (Ti/TiN), tungsten and Ti-tungsten (Ti—W).

12. The LDMOS device as recited in claim 9, wherein the SCT trench is filled with a metallic plug forming the conductor comprising a refractory metal or platinum-group metal (PGM) filler.

* * * * *